United States Patent
Joshi et al.

(10) Patent No.: US 7,304,895 B2
(45) Date of Patent: Dec. 4, 2007

(54) BITLINE VARIABLE METHODS AND CIRCUITS FOR EVALUATING STATIC MEMORY CELL DYNAMIC STABILITY

(75) Inventors: Rajiv V. Joshi, Yorktown Heights, NY (US); Qiuyi Ye, Hopewell Junction, NY (US); Anirudh Devgan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 259 days.

(21) Appl. No.: 11/225,571

(22) Filed: Sep. 13, 2005

(65) Prior Publication Data

US 2007/0058448 A1    Mar. 15, 2007

(51) Int. Cl.
*G11C 29/00* (2006.01)

(52) U.S. Cl. ............... 365/189.01; 365/154; 365/201; 365/203

(58) Field of Classification Search .......... 365/204
See application file for complete search history.

(56) References Cited

U.S. PATENT DOCUMENTS

| | | | |
|---|---|---|---|
| 5,687,178 A | | 11/1997 | Herr et al. |
| 5,754,487 A | * | 5/1998 | Kim et al. ............ 365/203 |
| 6,434,070 B1 | * | 8/2002 | Itou et al. ............ 365/203 |
| 7,099,182 B2 | | 8/2006 | Ohtake et al. |
| 2005/0063232 A1 | | 3/2005 | Chan et al. |
| 2005/0078508 A1 | | 4/2005 | Chan et al. |

OTHER PUBLICATIONS

U.S. Appl. No. 11/077,313, Joshi et al.

* cited by examiner

*Primary Examiner*—Tan T. Nguyen
(74) *Attorney, Agent, or Firm*—Mitch Harris, Atty at Law, LLC; Andrew M. Harris; Casimer K. Salys

(57) ABSTRACT

Bitline variable methods and circuits for evaluating static memory cell dynamic stability provide a mechanism for raising the performance of memory arrays beyond present levels/yields. By altering the bitline pre-charge voltage of a static random access memory (SRAM) memory cell, operating the cell and observing changes in performance caused by the changes in the bitline voltage, the dynamic stability of the SRAM cell can be studied over designs and operating environments. Alternatively or in combination, the loading at the outputs of the cell can altered in order to affect the performance of the cell. In addition, cell power supply voltages can be split and set to different levels in order to study the effect of cell asymmetry in combination with bitline pre-charge voltage differences.

19 Claims, 4 Drawing Sheets

BITLINE VARIABLE METHODS AND CIRCUITS FOR EVALUATING STATIC MEMORY CELL DYNAMIC STABILITY

CROSS-REFERENCE TO RELATED APPLICATION

The present application is related to co-pending U.S. patent application "INTERNALLY ASYMMETRIC METHODS AND CIRCUITS FOR EVALUATING STATIC MEMORY CELL DYNAMIC STABILITY", Ser. No. 11/225,652, filed concurrently with this application by the same inventors and assigned to the same Assignee. The specification of the above-referenced application is incorporated herein by reference.

BACKGROUND OF THE INVENTION

1. Technical Field

The present invention relates generally to static memory circuits, and more particularly to a method and circuit for evaluating the dynamic stability of static memory cell designs.

2. Description of the Related Art

Memory speed and other performance factors are critical limitations in today's processing systems and are predicted to become even more of a critical limitation as technologies move forward. In particular, static random access memories (SRAMS) and memory cells are used in processor caches, registers and in some designs external to the system processors for fast access to data and program instructions.

With processor cycle frequencies reaching well above 4 Ghz, development of SRAM cells that can store and provide access to stored values within that period has become necessary. However, process scales necessary to achieve such access times are also increasingly subject to variability in circuit parameters such as device threshold voltages and channel dimensions. The variability is present both with respect to parameters of each die and across the production process where die-to-die variation must also be controlled, but tolerated within the robustness of the circuit design. Further, negative bias temperature instability (NBTI) provides another variable that changes over circuit lifetime and dictates a minimum voltage at which the cell state can be toggled during the entire lifetime of the circuit.

Present techniques for evaluating the AC performance of memory cells typically analyze the cell using a static "butterfly" curve to evaluate static margins of the cell signals. The butterfly curve describes the switching action of a cross-coupled inverter pair that provide the static memory cell function. The static butterfly curve analysis is not adequate for analyzing memory circuits scaled for operation at the above-mentioned frequencies, as dynamic effects in the devices are increasingly important as operating frequencies are increased and power supply voltages are decreased.

It is therefore desirable to provide a method and circuit for evaluating static memory cell stability as process size and power supply voltages are decreased.

SUMMARY OF THE INVENTION

The objective of evaluating SRAM cell stability is accomplished in a method and circuit. The circuit provides a unique mechanism for evaluating SRAM cell stability by introducing a variable bitline pre-charge voltage that differs from the voltage supplied to the SRAM cell. The stability of the SRAM cell can then by studied as the bitline voltage changes by observing when unstable operation occurs.

The bitline pre-charge circuit can be a pulsed pre-charge or a continuously active weak pull-up circuit. The pulsed circuit may be a half-select pulsed pre-charge circuit that pre-charges the bitlines upon a word line select portion of a read cycle and then floats the bitlines during the row select portion of the read cycle. The bitline voltage difference may be symmetric with respect to the cell voltage, or asymmetric bitline charging may be employed where only one bitline has an altered voltage with respect to the cell. The bitline voltage may be supplied by directly coupling to the bitlines from a tester to test pads connected to the bitlines and the pre-charge current (pulsed or constant) supplied through the pads.

The circuit under test may be a 6 transistor cell with a pair of cross-coupled back-to-back complementary transistor inverters with a series word/bit-line transmission control transistor between the output of each inverter and the corresponding word/bit-line or the cell may be a different design.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns test fixtures and methods for measuring the performance of memory arrays in order to facilitate design improvement and determination of operating margins. In particular, a special pre-charge circuit is provided on at least one column of the memory array that pre-charges the bitlines to a variable voltage. The voltage may be supplied through a test point on the die, which may be fabricated in a sacrificial metal layer or left permanently in the design, so that on-going production devices can be periodically evaluated to observe changes due to process variations. The memory array and methods probe the logical state (storage state) of a memory cell under test and observe its operation over changes in voltage at one or two bitline pre-charge circuit power supply inputs.

In addition, tests and circuits as described in the above-incorporated U.S. patent application "INTERNALLY ASYMMETRIC METHODS AND CIRCUITS FOR EVALUATING STATIC MEMORY CELL DYNAMIC STABILITY" can be combined with the variable bitline precharge method and circuits to yield a more robust spectrum of memory cell stability tests. The tests and circuits of the present invention can also be performed and implemented in conjunction with the tests and circuits included in the above-incorporated U.S. patent application "RING OSCILLATOR ROW CIRCUIT FOR EVALUATING MEMORY CELL PERFORMANCE" in order to determine other parameters such as minimum write times and read delay.

Figure 1:
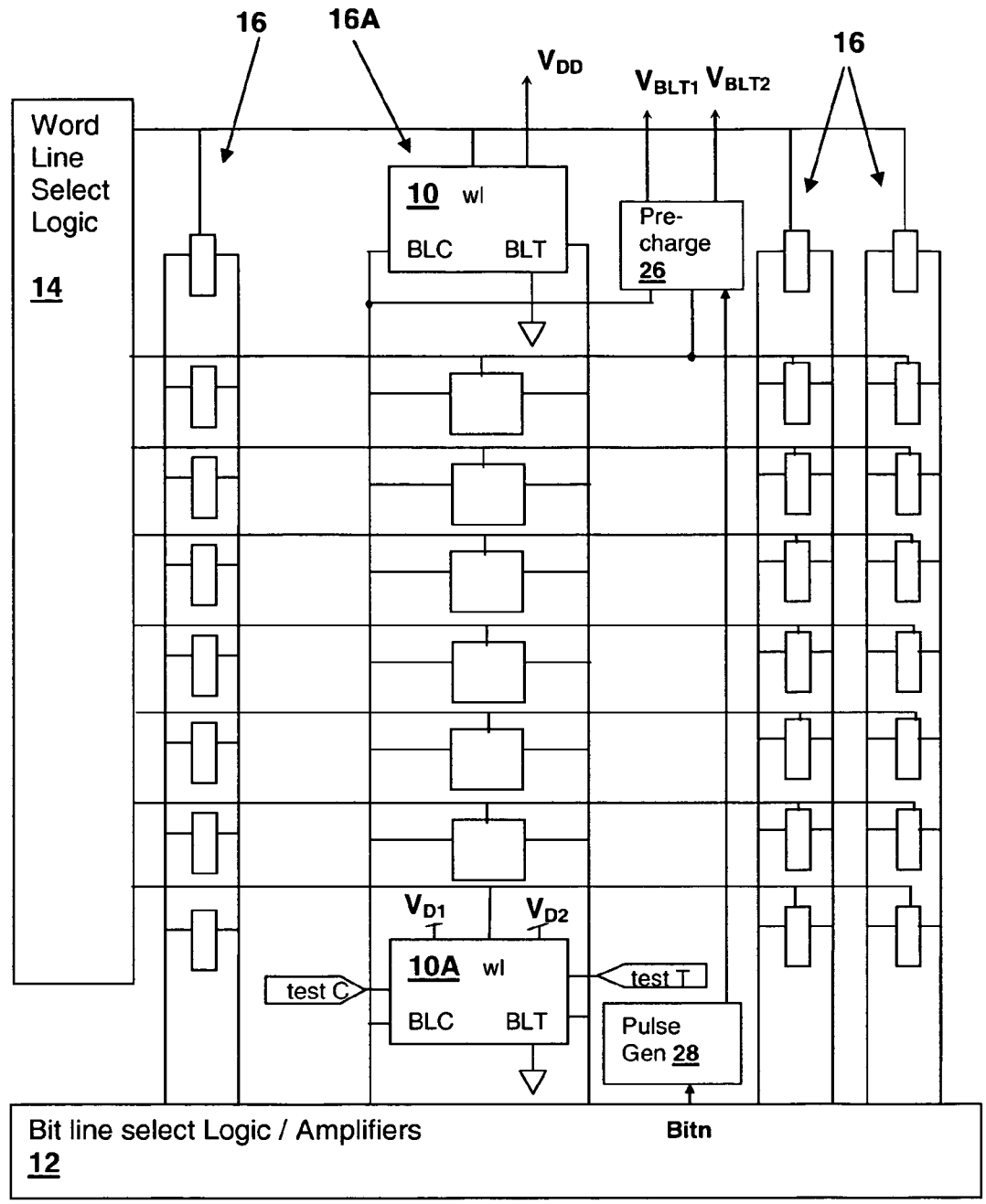
FIG. 1 is a schematic diagram of a memory array in accordance with an embodiment of the invention.

With reference now to the figures, and in particular with reference to FIG. 1, a memory array in accordance with an embodiment of the invention is shown. The memory array includes multiple memory cell columns 16 assembled from memory cells 10 and additionally, at least one test column 16A that includes a pre-charge circuit 26 having a variable power supply input $V_{BLT1}$, and optionally a second power supply input $V_{BLT2}$ that are used to vary the pre-charge voltage applied to the bitlines prior to (and optionally during) a read operation. Pre-charge circuit 26 is connected to the bitlines and provides a pulsed operation that pre-charges the bitlines prior to wordline select logic 14 enabling memory cells 10 of a selected row. Pulse generator 28 receives an indication of selection of a bitline Bitn from bit line select logic 12 and generates a pulse that elapses just prior to the wordline enable. Alternatively, pre-charge circuit 26 may include weak pull-ups that are enabled continuously and have a varying source voltage set by variable power supply input $V_{BLT1}$, and optionally second power supply input $V_{BLT2}$. $V_{BLT1}$, and optionally second power supply input $V_{BLT2}$ may be supplied from a regulator or power supply feed line on the die, or test pads may be provided in the circuit layout to feed the bitline voltage(s) as a constant or pulsed source prior to the read operation.

During a read operation, if the bitline pre-charge voltages differ from the power supply of memory cells 10, then during a read operation, the cell value can change. In particular, if the bit-line pre-charge voltage is higher than the power supply voltage of memory cells 10, and if the state of a particular memory cell that is enabled for the read operation is at a logical "0" value with respect to that bitline (i.e., the bitline should be pulled low by the read operation), the memory cell may change state during the read operation, as the bitline charge (or weak pullup) overcomes the cell's latching ability. Similarly, if the bitline voltage is low and the memory cell is at a logical "1" value with respect to the bitline, then the state of the memory cell can also be changed during the read operation. By changing the voltage used to pre-charge one or more bitlines, the stability of the cell can be determined and/or the internal noise level of the cell can be evaluated.

Memory cells 10 include bitline and bitline complement connections to a bitline select logic/sense amplifiers 12 block that selects the appropriate column output and provides the value of the memory cell to external circuits in response to a memory read operation. The row is selected by a particular word line asserted from a word line select logic 14. Word line select logic 14 and bitline select logic/sense amplifiers 12 are only needed in complete form for operationally functional memory arrays and a test memory array can be constructed without the complete functionality of a production memory array. However, to perform all of the tests that will be described below, the ability to write all memory cells 10 including a special test memory cell 10A as well as the ability to read at least the logical value of a test memory cell 10A is needed. However, such reading and writing can be performed via boundary scan circuits or other techniques that do not require the full read/write access logic of a production static memory array and test memory cell 10A and its associated tests are not required to practice the present invention. The use and structure of test memory cell 10A are described in the above-incorporated U.S. patent application "INTERNALLY ASYMMETRIC METHODS AND CIRCUITS FOR EVALUATING STATIC MEMORY CELL DYNAMIC STABILITY", and will also be described in detail below.

If test memory cell 10A is incorporated in the memory array, split power supply connections are provided to test memory cell 10A, which are shown as $V_{D1}$ and $V_{D2}$. One of power supply connections $V_{D1}$ and $V_{D2}$ may be connected to the $V_{DD}$ power supply rail that supplies the remainder of the memory array. Also, or in the alternative, the ground connection to test cell 10A can be isolated. In essence, the isolation of at least one of the power supply rails supplying at least one of the cross-coupled stages that provides the storage latch within test memory cell 10A permits varying the voltage swing at the input of the other stage. Reducing the voltage swing of the stage that is making the storage state change permits evaluation of the "noise level" of the memory cell as the voltage swing is decreased or determining the "noise margin" of the memory cell under particular leakage, loading and operating conditions.

Figure 2A:
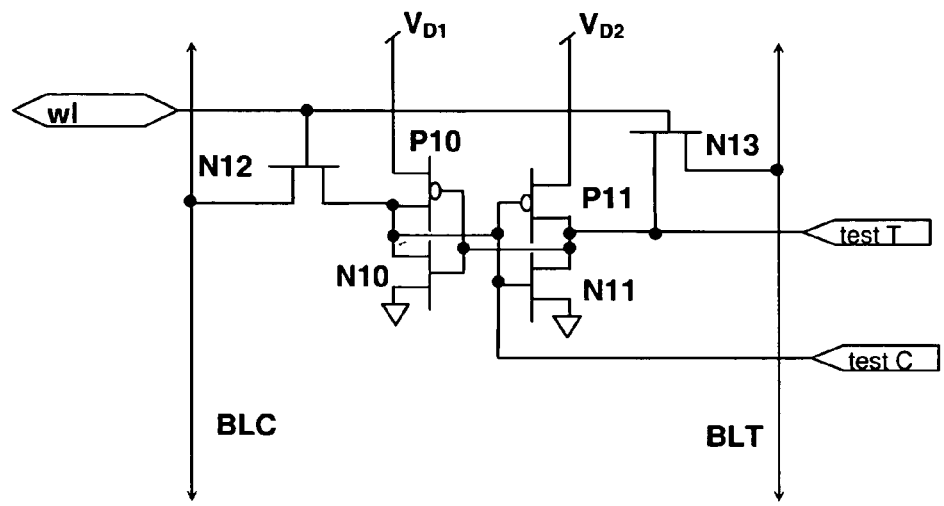
FIG. 2A is a schematic diagram of test memory cell 10A of FIG. 1.

Referring now to FIG. 2A, details of test memory cell 10A of FIG. 1 are shown in accordance with an embodiment of the invention. Transistors P10, N10, P11 and N11 form a static latch that provides the storage of a value in the cell via a pair of cross-coupled inverter stages. Transistors N10 and P10 form one inverter stage and transistors N11 and P11 form the other inverter stage. Transistors N12 and N13 provide for access to the value in response to a wordline select signal WL. Bitlines BLT (true bitline) and BLC (complement bitline) couple all cells in a column, so that when a row is selected by signal WL, only one row cell from each column is exposed to the memory logic. Internal nodes are accessible via test points (Test T and Test C) the permit measurement of the state and noise levels within the storage latch of test memory cell 10A and are generally brought out on test pads accessible by a test system. Addition of pads and lines for test points Test T, Test C add a degree of capacitance that must be taken into account in any implementation and measurement.

For a write operation, bitlines BLC and BLT are charged to voltages corresponding to the desired state of the memory cell and WL is activated (pulsed), setting the state of the latch formed by transistors P10, N10, P11 and N11. For a read operation, the bitlines BLC and BLT are previously charged to opposite state predetermined voltages (generally $V_{DD}$ and ground), and to commence the read, WL is pulsed and a sense amplifier coupled to bitlines BLC and BLT determines the stored state by differential comparison of bitlines BLC and BLT. While the illustrated cell is an example of a cell of order 4 that may be analyzed and improved by a method according to an embodiment of the invention, it should be understood that the techniques illustrated herein may be applied to static memory cells of any order.

As pointed out above, test memory cell 10A differs from typical memory cells (and the other memory cells 10 in the memory array of FIG. 1) in that separate power supply connections $V_{D1}$ and $V_{D2}$ are provided so that a different voltage that is generally lower than $V_{DD}$ can be supplied to at least one of the inverters forming memory cell 10A for additional testing of dynamic characteristics of the memory cells. The additional testing is performed so that variations in the parameters of the devices in the memory cells do not cause the devices to fail and enhance the overall information gathering provided by the bitline varying method of the present invention. Changing the output voltage of one of the inverters introduces an asymmetry that simulates conditions that occur due to asymmetry in devices making up the memory cells that can cause a failure in a memory cell write operation or cause the state of a memory cell to toggle when read.

In particular, with respect to the memory cell depicted in FIG. 2A, when the stored value is a logical "0" (with respect to the bitline values), the common channel connection of transistors P10 and N10 is near ground. When a logical "1" is written to the cell, if transistors P10, N11 and/or N12 are "weak" (i.e., high resistance) and/or transistors N10 and/or P11 are too "strong" (i.e., low resistance) the write operation can fail to change the state of the memory cell. For a read operation, if transistor N11 is weak and transistors P11 and/or N13 are strong, a read operation may change the state of the cell. When the value stored in the memory cell is a logical "1", the critical transistor sets are reversed, with variations in transistors N12, N10 and P10 causing potential failure of the write operation and variations transistors N11, N13 and P11 causing potential failure of the read operation. The statements above are true for both the split-power supply cell depicted and for the standard memory cell where both power supplies $V_{D1}$ and $V_{D2}$ are connected to $V_{DD}$ as in standard memory cells 10 and the change in state of the memory cell during a read operation can be affected simultaneously by bitline pre-charge voltage as well as variations in the cell and any voltage asymmetry introduced in a test cell.

Static tests or simulations will not reveal all of the performance characteristics due to the device parameter changes, as charge-sharing effects and other dynamic characteristics can cause the memory cell to fail in dynamic operation, but appear to operate properly when statically operated or simulated. The read operations can be simulated by varying the bitline voltage until a undesired change of state is observed. Similarly all of the above operations can be simulated by reducing voltage $V_{D1}$ while maintaining voltage at full $V_{DD}$ and reading/writing test memory cell 10A using a pulse width consistent with the normal access times of test memory cell 10A.

As described in the above-referenced U.S. patent application, another effect that can change the performance of memory cells 10 and test memory cell 10A is the effect of leakage from other non-enabled cells 10 connected to the column bitlines (i.e., those memory cells 10 in column 16A of FIG. 1). Depending on the voltage present on the opposite side of the pass transistors that connects each memory cell 10 to the bitlines, the leakage polarity will differ, and therefore the states of the memory cells connected to the same bitlines can change the performance of test memory cell 10A. The method of the present invention performs tests on memory cell 10 and/or test memory cell 10A that include algorithms to vary the bitline values on non-enabled cells in order to determine their effect on memory cell 10, 10A performance. Further, the loading on the bitlines also has an effect on memory cell performance independent of the state of the other memory cells. Both the leakage and loading effects change with the dimensions of the memory array in that the larger the column, i.e., the number of memory cells 10 connected to a common pair of bitlines, the greater the potential leakage and loading effects.

Figure 2B:
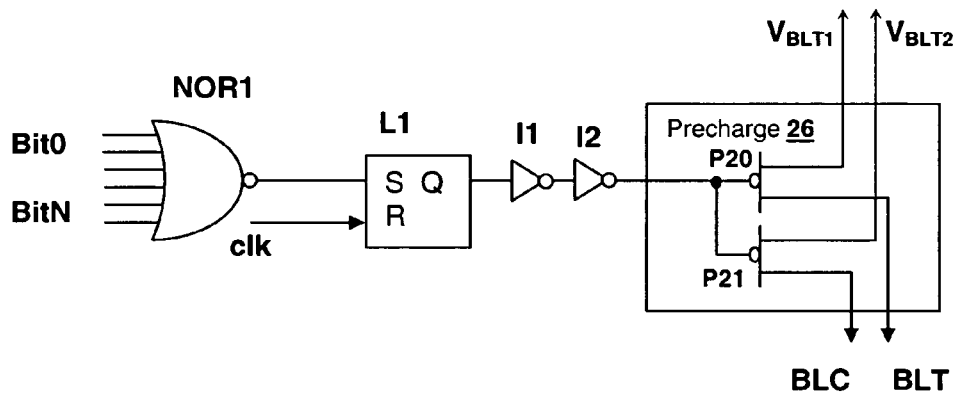
FIG. 2B is a schematic diagram showing details of pre-charge circuit 26 and pulse generator 28 of FIG. 1.

Referring now to FIG. 2B, details of pulse generator 28 and pre-charge circuit 26 are depicted. A logical NOR gate NOR1 combines the bit select signals to determine when a bitline has been selected for a read. A latch L1 is previously reset by a clock signal clk and is set by the output of logical NOR gate NOR1 and again cleared by clock signal clk to generate a pulse that is delayed by inverters I1 and I2 to provide a pulse to precharge circuit 26. Within precharge circuit, transistors P20 and P21 are activated during the pulse to charge the bitlines prior to the wordline becoming active. Further details of pulse generators for floating bitlines and the relationship of the bitline pulse to read control signals are disclosed in published U.S. Patent Application 2005/0078508A1, the specification and drawings of which are incorporated herein by reference. Distinct from the precharge circuit disclosed in the above-incorporated U.S. patent application are variable power supply inputs $V_{BLT1}$, and optionally a second power supply input $V_{BLT2}$. If second power supply input $V_{BLT2}$, then both of transistors P20 and P21 are connected to power supply input $V_{BLT1}$, which could be supplied by an on-wafer or on-die programmable power supply, but are generally provided from test pads accessed from a test probe. Additionally, a third shunt transistor can be incorporated as described in the above-incorporated U.S. patent application if a single power supply is used to charge the bitlines.

Figure 3:
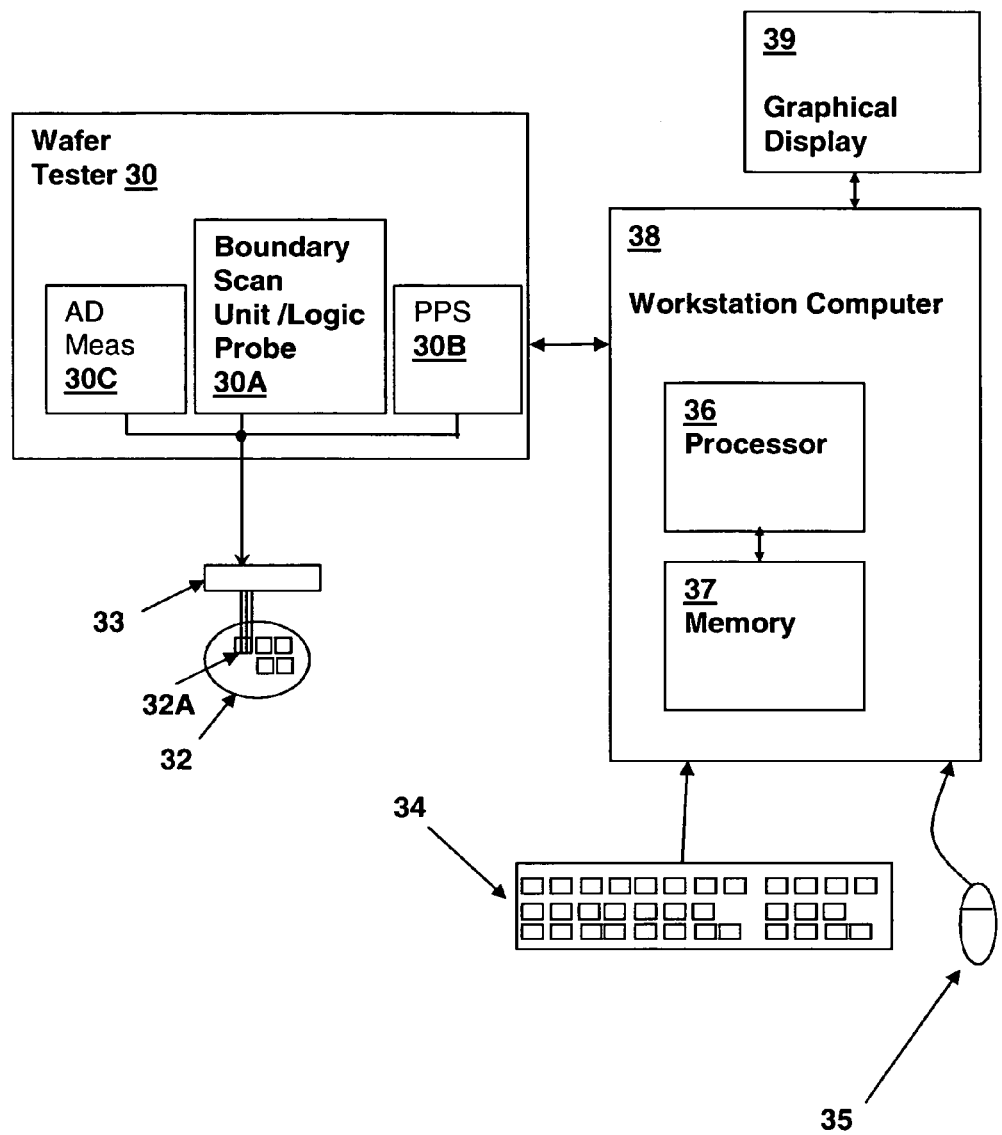
FIG. 3 is a block diagram of a wafer test system for testing a memory array via a method in accordance with an embodiment of the invention.

Referring now to FIG. 3, a VLSI wafer test system, in which methods according to an embodiment of the present invention are performed, is depicted. A wafer tester 30 includes a boundary scan unit 30A for providing stimulus to and retrieving data from a die 32A on a wafer under test 32 via a probe head 33 having electrical test connections to die 32A. Wafer tester 30 also includes a programmable power supply 30B for supplying bitline power supply voltage $V_{BLT1}$ (and optionally $V_{BLT2}$) as well as power supply rail voltage $V_{D1}$ and/or power supply voltage $V_{D2}$ to test memory cell 10A if test memory cell 10A is used to introduce asymmetry testing. Alternatively, programmable power supply 30B may control one or more programmed (limited) power supply currents supplied to terminals labeled $V_{D1}$ and/or $V_{D2}$. Wafer tester 30 also optionally includes an analog or digital measurement subsystem 30C for observing the states/values of the test points of test memory cell 10A that bring out test points Test T, Test C that are connected to the internal nodes of the storage latch within test memory cell 10A. By measuring the voltage internal nodes of test memory cell 10A, the cell state and level of noise in the storage cell can be determined directly and independently from the bitline states and noise.

A workstation computer 38, having a processor 36 coupled to a memory 37, for executing program instructions from memory 37, wherein the program instructions include program instructions for receiving data produced by circuits within wafer 32 in accordance with an embodiment of the present invention, is coupled to wafer tester 30. The data produced by embodiments of the present invention are collected from multiple tests of memory cells 10 and/or test memory cells 10A within dies 32A as one or more of the bitline precharge circuit 26 power supply voltages are varied by programmable power supply 30B, asymmetry is introduced into test cell 10A by varying power supply voltages $V_{D1}$ and/or $V_{D2}$, and loading/leakage characteristics are changed by using boundary scan unit 30A to set the states of other memory cells 10 to observe changes in leakage due to the states of other memory cells 10 in relation to the state of test memory cell 10A.

Measurement from analog or digital measurement subsystem 30C further increase the performance data set collected from measurements on test memory cell 10A. The results of all of the measurements can then be evaluated to either change the design of the array or memory cells 10, determine whether fabrication process has deviated exceedingly from tolerable norms or to determine operational ranges such as power supply voltage tolerances and access times.

Data from memory tests in accordance with embodiments of the invention are transferred to workstation computer 38 via wafer tester 30 and stored in memory 37 and/or other media storage such as a hard disk. Workstation computer 38 is also coupled to a graphical display 39 for displaying program output such as the results of memory tests described hereinafter. Workstation computer 38 is further coupled to input devices such as a mouse 35 and a keyboard 34 for receiving user input. Workstation computer may be coupled to a public network such as the Internet, or may be a private network such as the various "intra-nets" and software containing program instructions for analyzing data produced by methods and circuits in accordance with embodiments of the present invention may be located on remote computers or locally within workstation computer 38. Further, workstation computer 38 may be coupled to wafer tester by such a network connection.

While the system of FIG. 3 depicts a configuration suitable for sequential test of a plurality of dies on a wafer, the depicted system is illustrative and not limiting to the present invention. Probe head 33 may be a multi-die full wafer probe system, or may comprise multiple probe heads for simultaneously testing multiple wafers on a single or multiple die basis. Additionally, while boundary data retrieval and stimulus is illustrated, the techniques of the present invention may also be applied to other interfaces available to probe wafer 32, or applied to circuits implemented in fully functional dies where data extraction is performed over a serial or parallel bus or other interface.

Figure 4:
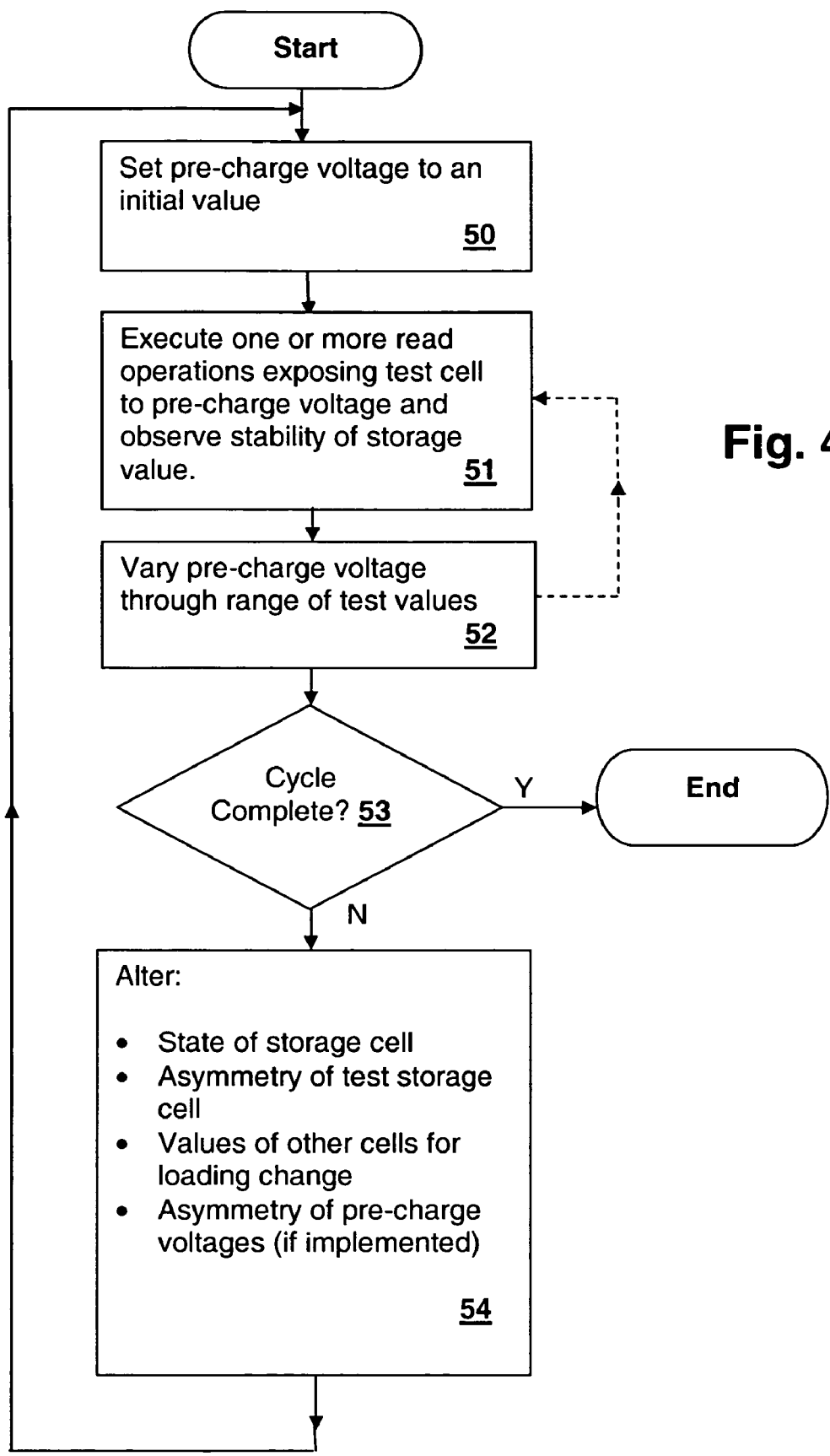
FIG. 4 is a flowchart illustrating a method in accordance with an embodiment of the invention.

Referring now to FIG. 4, a method in accordance with an embodiment of the present invention is depicted in a flowchart. It will be understood that there are many possible arrangements of the above-described tests and the present flowchart only expresses a simplified organization of on exemplary possibility and therefore should be taken as example only and not a limitation on the scope of the present invention. First, the pre-charge voltage to supply to the bitlines is set to an initial value (step 50) and one or more read operations are performed and the stability of the cells are observed as an absence of state changes (step 51) the value of the bitline voltage(s) is varied through the range of bitline voltage test values (step 52) and step 51 is repeated until the range is complete. Then, if the cycle of testing is complete (decision 53) then the test is ended, other wise other test parameters can be altered and steps 50-53 repeated (step 54). The parameters that can be altered include, the state of the memory cell 10 or 10A being read, any voltage asymmetry introduced in a special test memory cell 10A, values of other cells on the column for loading changes and any asymmetry of pre-charge voltages if two inputs are present on pre-charge circuit 26. All or part of the tests can be repeated after temperature cycling in order to determine changes due to NBTI, and tests are also performed over temperature and $V_{DD}$ ranges as well as the pre-charge voltage variations, in order to verify performance over intended operating conditions.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A memory device, comprising:
a plurality of memory cells organized as an array of rows and columns of said memory cells and operated by at least one first power supply voltage, wherein each of said cells in a given column are commonly connected to at least one bitline; and
a bitline pre-charge circuit connected to said at least one bitline, said bitline pre-charge circuit having at least one second power supply voltage input, and wherein said at least one second power supply voltage input receives a variable input voltage whereby an effect of variation of said second power supply voltage input on stability of at least one of said plurality of memory cells is observed.

2. The memory device of claim 1, further comprising at least one pulse generating circuit coupled to said bitline pre-charge circuit for generating a pulse in response to access to one of said columns of memory cells, and wherein said bitline pre-charge circuit is disabled responsive to said pulse to float said at least one bitline prior to enabling a particular one of said memory cells of said given column corresponding to a given row of said array.

3. The memory device of claim 2, wherein said first connection is provided on a probe area of a die on which said memory device is integrated, whereby a test system can alter a voltage of said first inverter power supply input with respect to a voltage of said second inverter power supply input by supplying said first inverter power supply voltage of said first inverter stage by contact of a probe with said probe area.

4. The memory device of claim 1, wherein said bitline pre-charge circuit is a weak pull-up that remains active during access to said memory cells.

5. The memory device of claim 1, wherein each of said plurality of memory cells comprises a symmetric storage latch including a first inverter stage and a second inverter stage with an output of the first inverter stage providing an input to the second inverter stage and an output of the second inverter stage providing an input to the first inverter stage whereby a state of the memory cell is statically maintained, and wherein at least one test memory cell within said plurality of memory cells further comprises an asymmetric pair of connections, a first connection to said first inverter stage of said at least one test memory cell and a second connection to said second inverter stage of said at least one test memory cell, whereby a stability of said at least one test memory cell can be evaluated by varying the asymmetry between said pair of connections and observing operation of said at least one test memory cell.

6. The memory device of claim 5, wherein said first connection is connected to a first inverter power supply input of said first inverter stage and said second connection is connected to a second corresponding inverter power supply input of said second inverter stage, and wherein said first connection and said second connection are asymmetric in voltage, whereby said stability of said memory cell is evaluated by varying a power supply voltage of at least said first inverter power supply input.

7. The memory device of claim 1, wherein said at least one second power supply voltage input of said bitline pre-charge circuit is provided on a probe area of a die on which said memory device is integrated, whereby a test system can alter a voltage of said pre-charge circuit with respect to an operating voltage of said plurality of memory cells by supplying said variable input voltage by contact of a probe with said probe area.

8. The memory device of claim 1, wherein said at least one bitline comprises two complementary bitlines, wherein said at least one second power supply voltage input comprises two pre-charge power supply voltage inputs and wherein said bitline pre-charge circuit couples a corresponding one of said two pre-charge power supply voltage inputs to a corresponding one of said complementary bitlines, whereby an effect of differences between voltages of said two pre-charge power supply voltage inputs on stability of said plurality of memory cells in said given column is observed.

9. The memory device of claim 1, wherein each of said plurality of memory cells comprises a symmetric storage latch including a first inverter stage and a second inverter stage with an output of the first inverter stage providing an input to the second inverter stage and an output of the second inverter stage providing an input to the first inverter stage whereby a state of the memory cell is statically maintained, and wherein at least one test memory cell within said plurality of memory cells further comprises a test point connected to an output of the first inverter stage provided on a probe area of a die on which said memory device is integrated, whereby a test system can measure internal characteristics of said at least one test memory cell by contact of a probe with said probe area.

10. A method for testing a memory cell of a memory array, said method comprising:
providing a cell voltage as a power supply to said memory cell;
pre-charging at least one bitline connected to said memory cell to a pre-charge voltage differing from said cell voltage;
observing a state of said memory cell while reading said memory cell; and
varying said pre-charge voltage and repeating said pre-charging and observing, whereby an effect of said pre-charge voltage on stability of said memory cell is observed.

11. The method of claim 10, wherein said pre-charging comprises pulsing said at least one bitline with said pre-charge voltage for a single pulse, whereby said at least one bitline is floated at said pre-charge voltage after a duration of said pulse has elapsed.

12. The method of claim 10, wherein said pre-charging comprises continuously supplying said pre-charge voltage to said at least one bitline through a weak pull-up circuit.

13. The method of claim 10, further comprising:
setting an asymmetric relationship between inverter stages of said memory cell, wherein said inverter stages are cross-coupled to provide a storage latch; and
observing an effect of said asymmetry on dynamic stability of said memory array as said asymmetric relationship is varied.

14. The method of claim 13, wherein said setting is performed by adjusting a power supply rail voltage of a given one of said inverter stages with respect to another one of said inverter stages.

15. The method of claim 14, further comprising supplying said power supply rail voltage of said given inverter stage through a probe contacting a terminal disposed on a die in which said memory array is integrated.

16. The method of claim 10, further comprising supplying said pre-charge voltage stage through a probe contacting a terminal disposed on a die in which said memory array is integrated.

17. The method of claim 10, wherein said at least one bitline comprises two complementary bitlines and wherein said pre-charging precharges each of said complementary bitlines to a different pre-charge voltage.

18. The method of claim 10, wherein said observing further comprises probing an internal node of said memory cell during said observing.

19. A memory device, comprising:
a plurality of memory cells organized as an array of rows and columns of said memory cells and operated by at least one first power supply voltage, wherein each of said cells in a given column are commonly connected to at least one bitline;
means for varying a pre-charge voltage applied to at least one of said memory cells prior to a read operation with respect to a power supply voltage of said at least one memory cell, whereby an effect of said pre-charge voltage on stability of said at least one memory cell is observed and means for varying an asymmetry within said at least one memory cell, whereby an effect of said asymmetry on said stability of said at least one memory cell is observed.

* * * * *